United States Patent [19]
Burchfield

[11] Patent Number: 5,477,193
[45] Date of Patent: Dec. 19, 1995

[54] CURRENT SOURCE LOOP FILTER WITH AUTOMATIC GAIN CONTROL

[75] Inventor: Mark E. Burchfield, Austin, Tex.

[73] Assignee: Cyrix Corporation, Richardson, Tex.

[21] Appl. No.: 327,070

[22] Filed: Oct. 21, 1994

[51] Int. Cl.⁶ .......................... H03L 7/089; H03L 7/093
[52] U.S. Cl. .................. 331/8; 331/10; 331/17; 331/25; 327/157
[58] Field of Search .................. 331/17, 8, 10, 331/25; 327/148, 157, 552, 553

[56] References Cited

U.S. PATENT DOCUMENTS

| | | | |
|---|---|---|---|
| 3,594,649 | 7/1971 | Rauch | 328/150 |
| 4,498,020 | 2/1985 | Giolma et al. | 307/261 |
| 4,692,717 | 9/1987 | Ouyang et al. | 331/111 |
| 4,812,784 | 3/1989 | Chung et al. | 331/113 R |
| 4,922,139 | 5/1990 | Giebel | 307/520 |
| 4,959,618 | 9/1990 | Shier | 327/157 |
| 4,987,387 | 1/1991 | Kennedy et al. | 331/1 A |
| 5,300,898 | 4/1994 | Chen et al. | 331/57 |
| 5,341,113 | 8/1994 | Baron et al. | 331/144 |
| 5,384,502 | 1/1995 | Volk | 327/157 |
| 5,422,603 | 6/1995 | Soyuer | 331/17 |

*Primary Examiner*—Siegfried H. Grimm
*Attorney, Agent, or Firm*—John L. Maxin; Andrew S. Viger

[57] ABSTRACT

A current source suitable for use as a loop filter in a phase-locked loop having two aspects of automatic gain control one for prohibiting the voltage controlled oscillator from stopping as the input voltage approaches the limits of the oscillator and another to compensate for current limiting drain to source voltage drops.

8 Claims, 2 Drawing Sheets

5,477,193

CURRENT SOURCE LOOP FILTER WITH AUTOMATIC GAIN CONTROL

BACKGROUND OF THE INVENTION

1. Field of the Invention

The invention relates generally to electronic current sources, and more particularly to a current source suitable for use as a loop filter in a phase-locked loop.

2. Description of Related Art

Without limiting the scope of the invention, this background information is provided in the context of a specific problem to which the invention has application. Phase-locked loops, a.k.a. PLLs are ubiquitous, found in many applications ranging from automobiles to microprocessors. A PLL is commonly used to synthesize a high frequency clock signal from and synchronous to, a lower frequency reference signal. In its most simplest form, a PLL comprises a voltage controlled oscillator (VCO), a prescaler, a phase comparator, and a loop filter. The output of the phase comparator drives the loop filter which typically is a low pass filter with gain. The loop filter provides an output voltage which drives the input of the VCO. The VCO output is then scaled through the prescaler and fed back to one input on the phase comparator. A second input on the phase comparator is coupled to a reference signal that the VCO output frequency attempts to track, scaled by an mount set by the prescaler. The phase comparator generates an error signal to force the frequency of the VCO up or down depending on whether the scaled VCO output is leading or lagging the phase of the reference input.

A common trend in modern electronics is the reduction of the power supply voltage. This is being done, for the most part, to reduce power consumption and to increase integrated circuit densities. Although these objectives are laudatory, the attendant drawbacks of lowering the power supply voltage can compete with the benefits obtained. Specifically, as the power supply voltage is reduced in a PLL, the available voltage swing is reduced thereby compressing the frequency-lock range of the PLL. A particular problem in MOSFET circuitry with reducing the power supply voltage is overcoming the current limiting characteristics as the drain to source voltage ($V_{DS}$) approaches zero.

Known prior art loop filters for use with VCOs and PLLs include, U.S. Pat. No. 4,922,139, issued May 1, 1990, entitled "Filter Circuit For Generating A VCO Control Voltage Responsive To The Output Signals From A Frequency/Phase Discriminator" which employs a form of gain control and $V_{DS}$ compensation but has a limited output voltage swing.

Another approach found in U.S. Pat. No. 4,987,387, issued Jan. 22, 1991, entitled "Phase Locked Loop Circuit With Digital Control" is silent on $V_{DS}$ compensation but discloses an automatic gain control circuit (120) employing an op-amp (121) for frequency gain, undesirable for reduced voltage operation.

Accordingly, it can be seen that there is a need for a current source suitable for use as a loop filter in a PLL which can overcome the obstacles of operating at reduced power supply voltage.

SUMMARY OF THE INVENTION

To overcome the limitations in the prior art described above, and to overcome other limitations that will become apparent upon reading and understanding the present specification, the present invention discloses a current source suitable for use as a loop filter in a PLL, having two aspects of automatic gain control. The loop filter employs a differential current source and passive low pass filters for providing a first and second bias voltage for biasing P channel and N channel devices in a VCO. To prohibit the VCO from stopping, the supplied current is reduced as the first bias voltage approaches the positive power supply rail and as the second bias voltage approaches the negative power supply rail.

A second aspect of automatic gain control in the present invention provides a parallel current path to compensate for a current limiting condition as the drain to source voltage approaches zero.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described specific examples of systems in accordance with the present invention.

BRIEF DESCRIPTION OF THE DRAWINGS

Referring now to the drawings in which like reference numerals and letters indicate corresponding elements throughout the several views.

DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
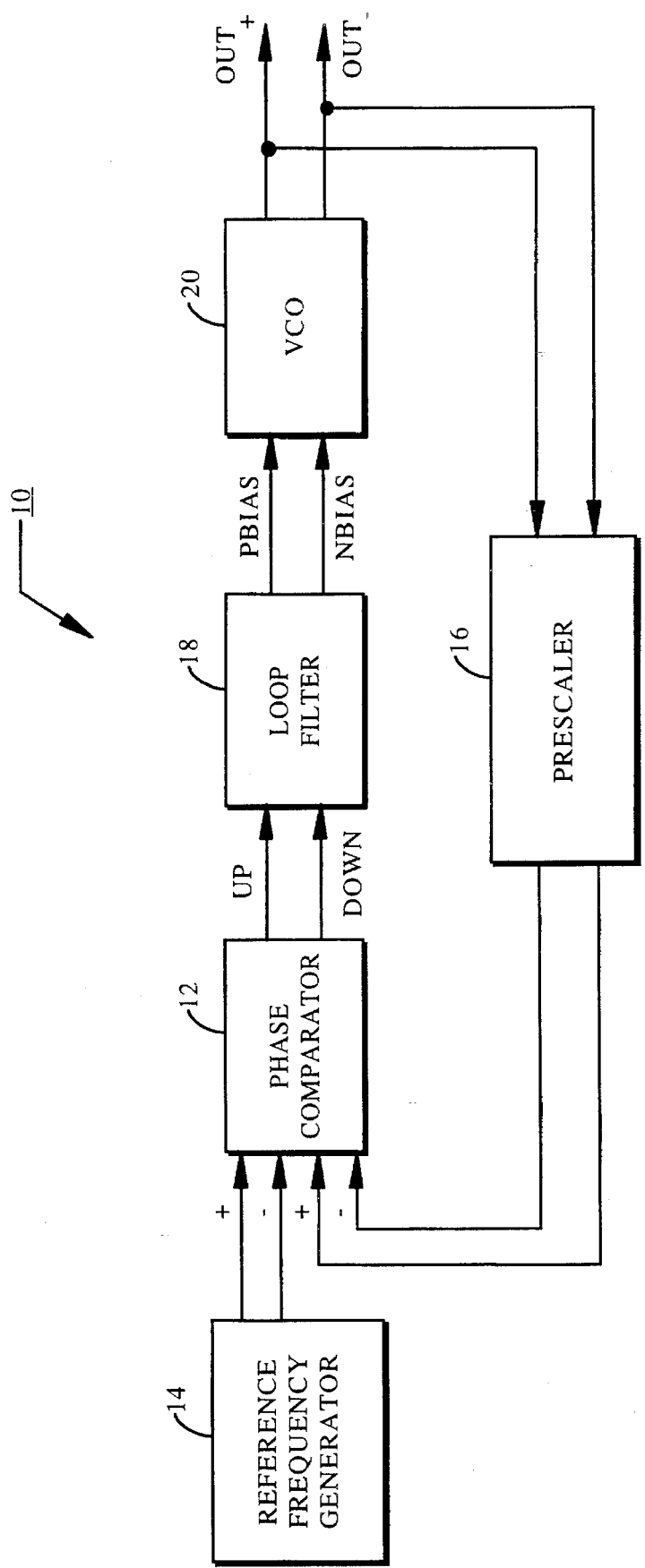
FIG. 1 is a block diagram of a phase-locked loop employing a current source as a loop filter practiced in accordance with the principles of the present invention; and, FIG. 2 is a detailed schematic diagram of the current source loop filter in FIG. 1.

Reference is now made to FIG. 1 which illustrates a block diagram of a phase-locked loop 10 employing a current source loop filter practiced in accordance with the principles of the present invention. The phase-locked loop 10 comprises a phase comparator 12, loop filter 18, VCO 20, and prescaler 16. The phase comparator 12 has differential inputs coupled to reference frequency generator 14 and prescaler 16, and has UP/DOWN output signals coupled to the input of a loop filter 18. The loop filter 18 has PBIAS and NBIAS voltage outputs coupled to the input of voltage controlled oscillator 20. The differential output from the voltage controlled oscillator 20 is coupled back through the prescaler 16 which divides it down and presents it to the phase comparator for comparison with the output from the reference frequency generator 14.

The details of the phase comparator 12, prescaler 16, and the voltage controlled oscillator 20 are not necessary for the understanding of the present invention. It is sufficient to understand that the phase comparator 12 asserts the UP signal when the output of the voltage controlled oscillator 20 is lagging the frequency of the reference generator 14 and likewise asserts the DOWN signal when the frequency is leading the reference generator 14. It is also sufficient to understand that the prescaler divides the frequency of the voltage controlled oscillator 20 by a divisor equal to the desired multiple frequency of the reference generator 14. An exemplary voltage controlled oscillator 20 can be found in copending and commonly assigned U.S. patent application 08/326,887 filed on Oct. 21, 1994 and now U.S. Pat. No. 5,434,545 herein incorporated by reference.

Figure 2:
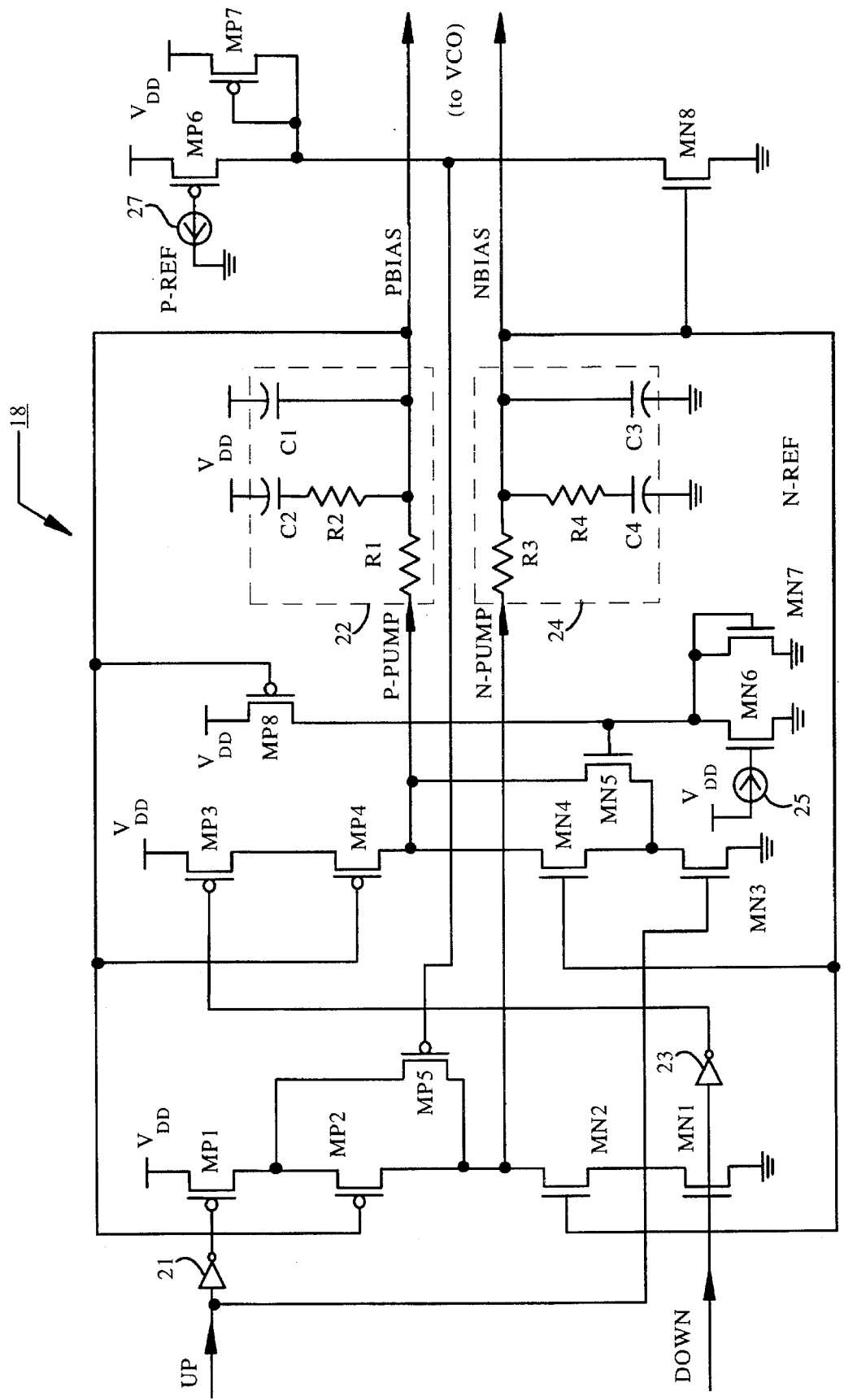

Reference is now made to FIG. 2 which depicts a detailed schematic diagram of the loop filter 18. It should be noted that P-channel MOSFET devices are prefixed by MP while N-channel devices are prefixed by MN. Transistors MP1, MP2, MN2, and MN1 are serially cascaded between the two power supply rails $V_{DD}$ and ground ($V_{ss}$). The UP signal from the phase comparator 12 is coupled to the gate of MN3 and through an inverter 21 to the gate of transistor MP1. The Down signal from the phase comparator 12 is coupled to the gate of MN1 and through an inverter 23 to the gate of transistor MP3. Transistor MP5 has its source and drain coupled in parallel with that of transistor MP2.

Transistors MP3, MP4, MN4, and MN3 are serially cascaded between the two power supply rails $V_{DD}$ and ground. The gates of transistors MP2, MP4, and MP8 are coupled to the PBIAS node, described in more detail hereinbelow. The gates of transistors MN2, MN4, and MN8 are coupled to the NBIAS node, described in more detail hereinbelow. Transistor MN5 has its source and drain coupled in parallel with that of transistor MN4. Transistors MN6 and MN7 are coupled in parallel with their sources tied to the ground power supply rail and their drains coupled to the gate of transistor MN5 and to the drain of transistor MP8. Transistor MN6 has its gate coupled to current source 25 while transistor MN7 is coupled in saturation with its gate coupled to its drain. Transistor MP8 has its source coupled to the $V_{DD}$ power supply rail.

Transistors MP6 and MP7 are coupled in parallel with their sources tied to the $V_{DD}$ power supply rail and their; drains coupled to the gate of transistor MP5 and to the drain of MN8, Transistor MP6 has its gate coupled to current source 27 while transistor MP7 is coupled in saturation with its gate coupled to its drain. Transistor MN8 has its source coupled to the ground power supply rail.

The PBIAS node is coupled through resistor R1 to the P-PUMP node formed by the junction of the drains of transistors MP4, MN4, and MN5. The PBIAS node is also coupled to the $V_{DD}$ power supply rail through the serial combination of resistor R2 and capacitor C2 in parallel with capacitor C1. The combination of R1, R2, C1, and C2 forms a low pass filter 22 which integrates the current produced at the P-PUMP node to form a voltage at the PBIAS node.

The NBIAS node is coupled through resistor R3 to the N-PUMP node formed by the junction of the drains of transistors MP2, MN2, and MP5. The NBIAS node is also coupled to the ground power supply rail through the serial combination of resistor R4 and capacitor C4 in parallel with capacitor C3. The combination of R3, R4, C3, and C4 forms a low pass filter 24 which integrates the current produced at the N-PUMP node to form a voltage at the node NBIAS.

For purposes of explanation, assume that the UP signal from the phase comparator 12 is pulled to the $V_{DD}$ power supply rail (asserted high) and the DOWN signal is pulled to the ground power supply rail (asserted low), indicating that the frequency of the VCO 20 should be increased. Transistors MN1 and MP3 are turned off terminating the current into the P-PUMP node for $V_{DD}$. Transistor MN3 is turned on pulling the sources of MN4 and MN5 and the P-PUMP node near the ground power: supply rail. Transistor MP1 is turned on pulling the sources of transistors MP2 and MP5 near the $V_{DD}$ power supply rail and supplies current to the N-PUMP node, thus increasing the voltage across the NBIAS node which in turn commands the VCO 20 to raise its frequency.

Assume now that the DOWN signal from the phase comparator 12 is pulled to the $V_{DD}$ power supply rail (asserted Thigh) and the UP signal is pulled to the ground power supply rail (asserted low), indicating that the frequency of the VCO 20 should be reduced. Transistor MN1 is turned on pulling the source of transistor MN2 near the ground power supply rail and transistor MP1 is turned off severing the current into the N-PUMP node. As the voltage falls on the NBIAS node, transistor MN2 conducts less, draining less current from the N-PUMP node. Transistor MP3 is turned on pulling the source of MP4 near the $V_{DD}$ power supply rail. The gate of MP4 which is coupled through R1 to its drain, is initially at a voltage less than its source voltage, thus transistor MP4 conducts current from $V_{DD}$ into the P-PUMP node. The low pass filter 22 integrates the current from the P-PUMP node to form a voltage on the PBIAS node. As the voltage on the PBIAS node thus the gate on transistor MP4 approaches $V_{DD}$, the gate-source voltage of transistor MP4 approaches zero, forcing it to conduct less current into the P-PUMP node. Likewise, as the voltage on the NBIAS node thus the gate on transistor MN2 approaches ground, the gate-source voltage of transistor MN2 approaches zero, forcing it to shunt less current from the N-PUMP node. In this manner, the PBIAS and NBIAS nodes throttle back the current into the P-PUMP node and out of the N-PUMP node as the voltage on PBIAS approaches the $V_{DD}$ power supply rail and the voltage approaches the ground power supply rail on NBIAS. This throttling is a form of automatic gain control to prevent MP4 and MN2 from going into saturation thus preventing the PBIAS node from reaching $V_{DD}$ and the NBIAS node from reaching ground which would stop the VCO 20.

The second aspect of automatic gain control in the present invention compensates for the drain to source voltage ($V_{DS}$)across transistors MP2 and MN2. $V_{DS}$ across transistor MP2 approaches zero when the voltage across the NBIAS node approaches $V_{DD}$. Consequently, the mount of current which can be conducted through MP2 is limited. To overcome this limitation, transistor MP5 is disposed in parallel with MP2. Transistor MP5 is normally biased off unless the voltage across NBIAS rises to a level high enough to trigger conduction. More specifically, transistors MP6 and MP7 are coupled between $V_{DD}$ and the gate of MP5. Transistor MN8 is coupled between the gate of MP5 and ground. Transistor MP7 is coupled in a saturated mode (gate to drain) while transistor MP6 is sufficiently biased on by current source 27 to pull the gate of MP5 towards $V_{DD}$ so that transistor MP5 is turned off. As the NBIAS node approaches $V_{DD}$, transistor MN8 conducts pulling the gate of MP5 to the ground power supply rail, thus turning on transistor MP5 and shunting it in parallel with transistor MP2. In this manner, transistor MP5 augments the amount of current flowing into the N-PUMP node. It will be understood by those skilled in the art that more than one transistor may be used for transistor MP5 to obtain the necessary current flow into the N-PUMP node as $V_{DS}$ approaches zero.

The P-PUMP node is compensated in a like fashion. Specifically, transistor MN5 is disposed in parallel With transistor MN4. Transistor MN5 is normally biased off unless the voltage across the PBIAS node falls low enough to trigger conduction. More specifically, transistors MN6 and MN7 are coupled between ground and the gate of MN5. Transistor MP8 is coupled between the gate of MN5 and $V_{DD}$. Transistor MN7 is coupled in a saturated mode (gate to drain) while transistor MN6 is sufficiently biased on by current source 25 to pull the gate of MN5 towards ground so that transistor MN5 is turned off. As the PBIAS node approaches ground, transistor MP8 conducts pulling the gate of MN5 to the $V_{DD}$ power supply rail, thus shunting MN5 in parallel with transistor MN4. In this manner, transistor MN5 augments the mount current supplied to the P-PUMP node. It will be understood by those skilled in the art that more than one transistor may be used for transistor MN5 to obtain the necessary current flow into the P-PUMP node.

Although the Detailed Description of the invention has been directed to certain exemplary embodiments, various modifications of these embodiments, as well as alternative embodiments, will be suggested to those skilled in the art. The invention has general applicability to any current source application and encompasses any modifications or alternative embodiments that fall within the scope of the claims.

What is claimed is:

1. A loop filter with automatic gain control operating between a positive and a negative voltage supply rail, comprising:
   (a) a current source having first and second inputs coupled to up rand down control signals and first and second current outputs;
   (b) a first low pass filter having an input coupled to the first current output and an output providing a first bias voltage;
   (c) a second low pass filter having an input coupled to the second current output and an output providing a second bias voltage; and,
   (d) the current source reducing the first current output in response to the first bias voltage approaching the positive voltage supply rail and increasing the second current output in response to the second bias voltage approaching the negative voltage supply rail.

2. A loop filter as recited in claim 1 wherein the current source (a) comprises:
   (i) a first plurality of transistors serially cascaded between the positive and negative voltage supply rails for supplying the first current output;
   (ii) a second plurality of transistors serially cascaded between the positive and negative voltage supply rails for supplying the second current output; and,
   (iii) the up control signal controlling current sink for the first current output and current source for the second current output, the down control signal controlling current source for the first current output and current sink for the second current output.

3. A loop filter as recited in claim 2 wherein the current source (a) further comprises current augmenting means for augmenting the first current output in response to the first bias voltage approaching the negative power supply rail and for augmenting the second current output in response to the second bias voltage approaching the positive power supply rail.

4. A loop filter as recited in claim 3 wherein the current augmenting means comprises first and second transistors respectively coupled in parallel with a section of the first serially cascaded plurality of transistors and the second serially cascaded plurality of transistors, the first and second transistors respectively being conductive as the first bias voltage approaches the negative power supply rail and the second bias Voltage approaches the positive power supply rail.

5. In a phase-locked loop including a phase comparator and a voltage controlled oscillator, a loop filter comprising:
   (a) a current source having first and second inputs coupled to up and down control signals from the phase comparator and first and second current outputs coupled to the voltage controlled oscillator;
   (b) a first low pass filter having an input coupled to the first current output and an output providing a first bias voltage;
   (c) a second low pass filter:having an input coupled to the second current output and an output providing a second bias voltage; and,
   (d) in response to the first bias voltage approaching a positive voltage supply rail, the current source reducing the first current output and in response to the second bias voltage approaching a negative voltage supply rail, the current source increasing the second current output, so that the voltage controlled oscillator maintains oscillation.

6. A phase-locked loop as recited in claim 5 wherein the current source further comprises current augmenting means for augmenting the first current output in response to the first bias voltage approaching the negative power supply rail and for augmenting the second current output in response to the second bias voltage approaching the positive power supply rail.

7. In a phase-locked loop with a loop filter providing first and second bias voltages to a voltage controlled oscillator and operating between positive and negative voltage supply rails, a method for automatic gain control comprising the steps of:
   (a) supplying a first and second current to a first and a second low pass filter respectively;
   (b) reducing the first current in response to the first bias voltage approaching the positive voltage supply rail; and,
   (c) increasing the second current output in response to the second bias voltage approaching the negative voltage supply rail.

8. A method as recited in claim 7 further comprising the steps of:
   (d) augmenting the first current output in response to the first bias voltage approaching the negative power supply rail; and
   (e) augmenting the second current output in response to the second bias voltage approaching the positive power supply rail.

* * * * *